(12) United States Patent
Onobuchi et al.

(10) Patent No.: US 7,719,095 B2
(45) Date of Patent: May 18, 2010

(54) LEAD FRAME AND SEMICONDUCTOR DEVICE PROVIDED WITH LEAD FRAME

(75) Inventors: Seigoh Onobuchi, Fukuoka-ken (JP); Yasuo Yamasaki, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/327,923

(22) Filed: Dec. 4, 2008

(65) Prior Publication Data
US 2009/0146275 A1 Jun. 11, 2009

(30) Foreign Application Priority Data
Dec. 5, 2007 (JP) ............... 2007-315133

(51) Int. Cl.
*H01L 23/495* (2006.01)
(52) U.S. Cl. ...................... 257/666; 257/773
(58) Field of Classification Search ................ 257/666, 257/773, 775, 676
See application file for complete search history.

(56) References Cited

U.S. PATENT DOCUMENTS

| | | | |
|---|---|---|---|
| 4,797,787 A * | 1/1989 | Shimizu ..................... 361/813 |
| 5,459,350 A * | 10/1995 | Date et al. .................. 257/666 |
| 5,677,245 A * | 10/1997 | Brown et al. ................. 438/25 |
| 6,388,363 B1 * | 5/2002 | Kotani et al. ................ 310/320 |
| 2004/0262752 A1 * | 12/2004 | Ito et al. ..................... 257/734 |
| 2008/0002995 A1 | 1/2008 | Kamisuwa et al. |

FOREIGN PATENT DOCUMENTS

| JP | 06-120406 | 4/1994 |
|---|---|---|
| JP | 09-036298 | 2/1997 |

* cited by examiner

*Primary Examiner*—S. V Clark
(74) *Attorney, Agent, or Firm*—Turocy & Watson, LLP

(57) ABSTRACT

A lead frame and a semiconductor device having a lead frame are disclosed. The lead frame is provided with a mount bed to mount a semiconductor chip, first and second lead terminals and first and second extension portions of band-shapes. The first and the second extension portions extend from sides of the first and second lead terminals and are bent. An electronic component is attached to Tip portions of the first and the second extension portions with connection conductors interposed in between.

19 Claims, 10 Drawing Sheets

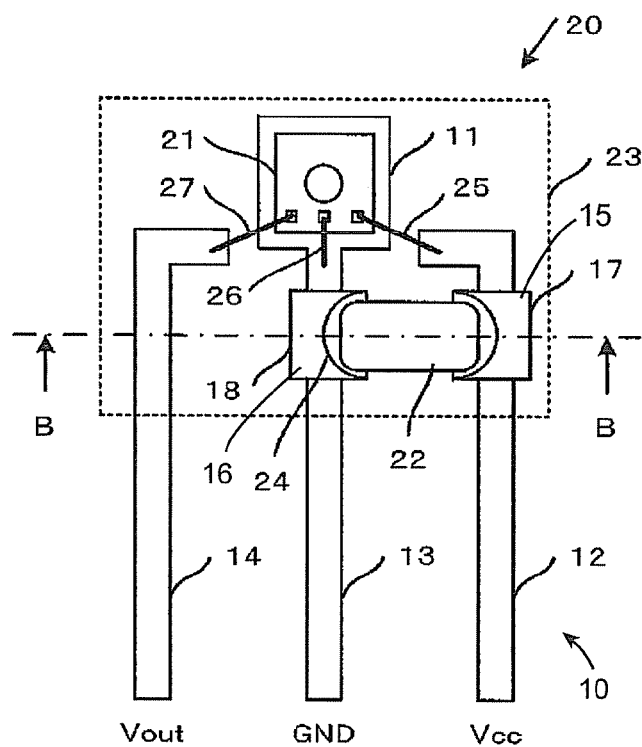 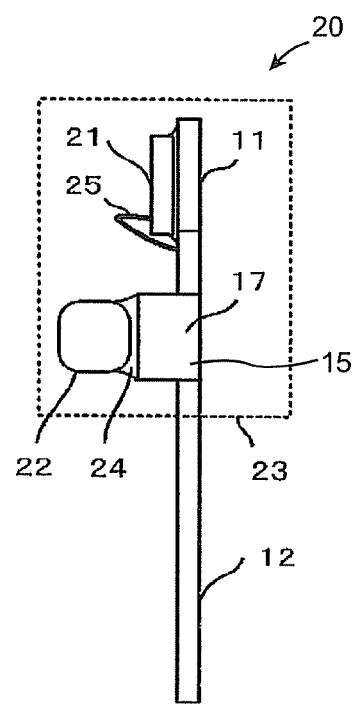
FIG. 2A  FIG. 2C
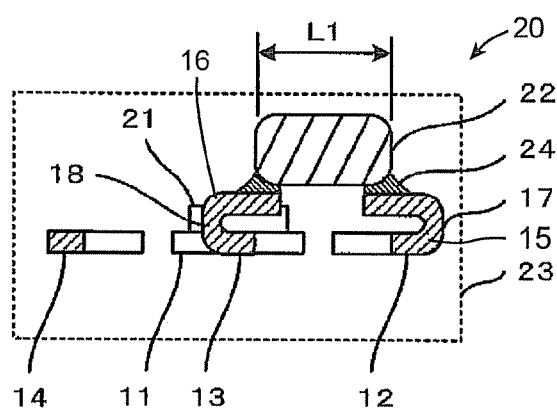
FIG. 2B

W1<W2

L1<L2

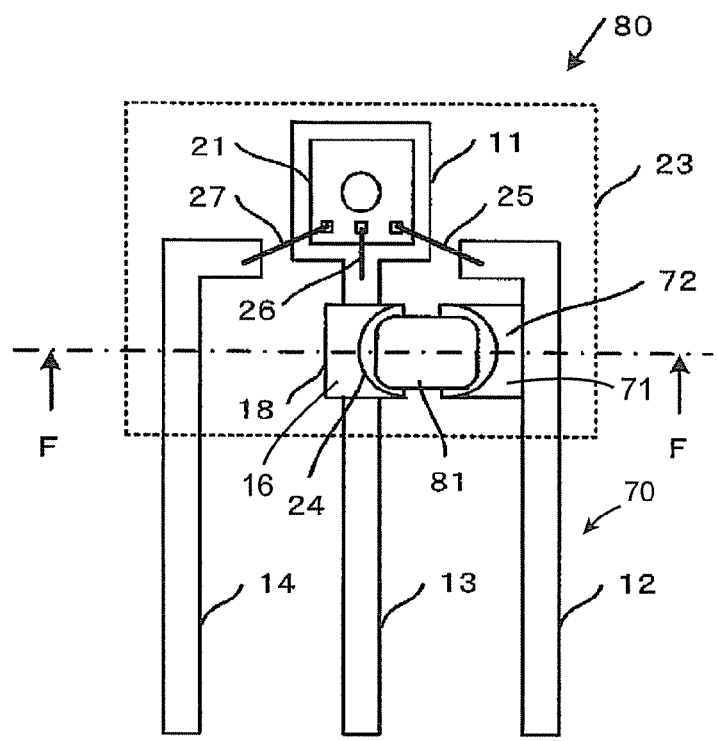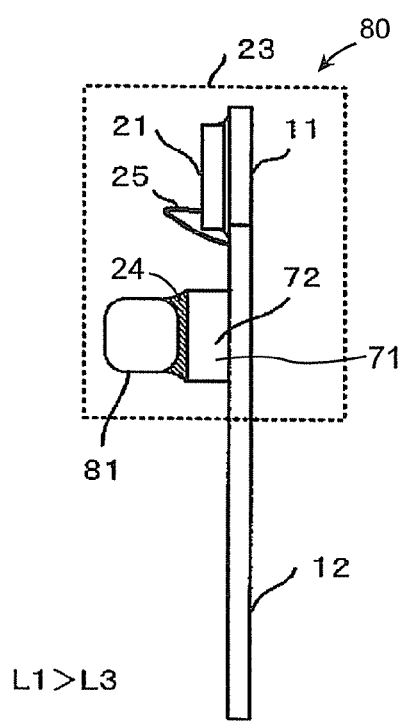
FIG. 8A  FIG. 8C
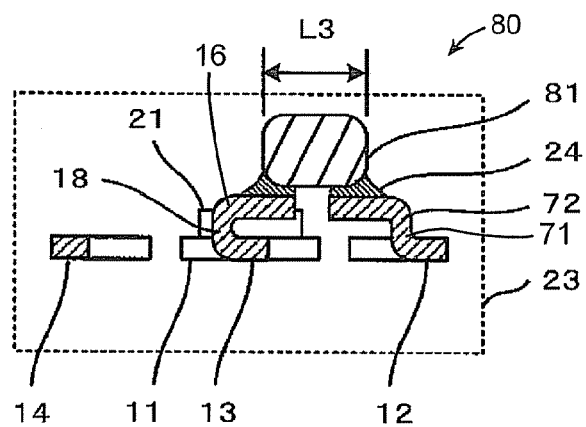
FIG. 8B

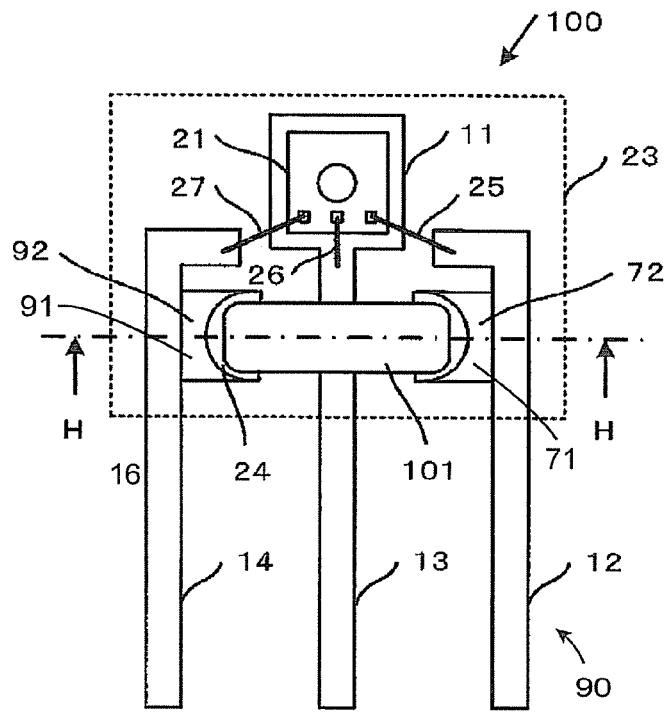
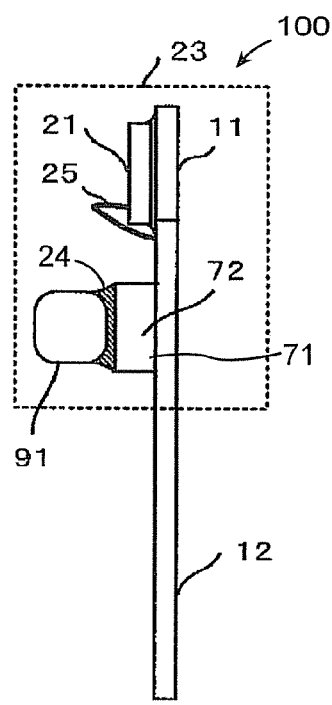
FIG. 10A
FIG. 10C
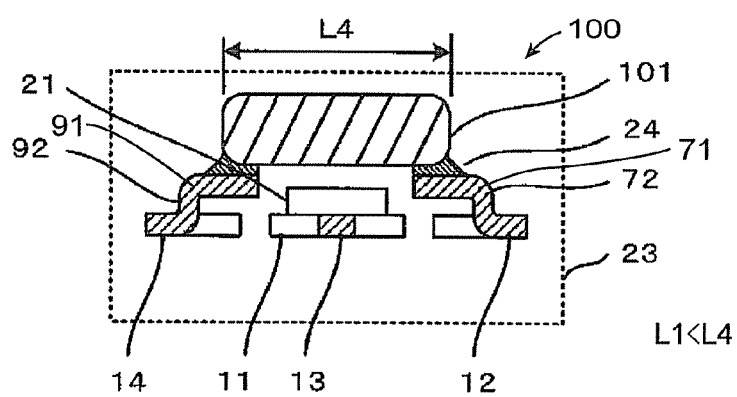
FIG. 10B

LEAD FRAME AND SEMICONDUCTOR DEVICE PROVIDED WITH LEAD FRAME

CROSS REFERENCE TO RELATED APPLICATION

This application is based upon and claims the benefit of priority from the prior Japanese Patent Application No. 2007-315133, filed on Dec. 5, 2007, the entire contents of which are incorporated herein by reference.

FIELD OF THE INVENTION

The present invention relates to a lead frame and to a semiconductor device provided with a lead frame.

DESCRIPTION OF THE BACKGROUND

A resin-sealed semiconductor device is widely used. The resin-sealed semiconductor device seals a semiconductor chip with resin.

In some cases, a chip component, which is a passive element such as a capacitor or a resistor, is provided in addition to a semiconductor chip in a resin-sealed semiconductor device.

A mounting portion may be formed between lead terminals extend portioning in parallel to each other, in order to mount a chip component. The chip component is mounted on the mounting portion with a conductive paste interposed in between. The chip component is fixed to the lead frame by heating the conductive paste to a curing temperature.

The conductive paste is a mixture of silver filler and epoxy resin, for example. When the conductive paste is thermally cured, the conductive paste may crack due to thermal stress caused by a difference in thermal expansion coefficient between the chip component and the lead frame.

Furthermore, when epoxy resin is prepared for the conductive paste and is cured, the cured epoxy resin may be embrittled with exposure to a high temperature. It may result in causing reduction in adhesion performance and impact resistance.

Japanese Patent Application Publication No. 6-120406 and Japanese Patent Application Publication No. 9-36298 disclose a semiconductor device capable of avoiding generation of thermal stress during curing.

The semiconductor device disclosed in the former patent publication is provided with a groove or a step as a stress absorber in an inner lead portion of a lead frame on which a chip component is mounted.

The semiconductor device mentioned in the latter patent publication has an extension portion formed in a lead frame. The extension portion extend portions to form a band shape which corresponds to a shape of an electrode of a chip component. The tip of the extension portion functions as a mounting portion to mount the electrode. A narrow-width portion, which has a width smaller than that of the mounting portion, is formed at a base end portion of the extension portion.

Such structures of the semiconductor devices disclosed in the above patent publications allow the semiconductor devices to bear thermal stress when the epoxy resin is cured. However, the semiconductor devices may be insufficient to bear heat or physical impact which is applied after curing. In the semiconductor device, a conductive paste, which fixes a chip component to a lead frame, may be cracked to cause the semiconductor devices to be electrically open. In some cases, the chip component may peel off, which shows poor reliability of the semiconductor devices.

SUMMARY OF THE INVENTION

According to an aspect of the invention, a lead frame is provided, which comprises a mount bed to mount a semiconductor chip, first and second lead terminals extending in parallel to each other in a first direction, a first extension portion being band-shaped and extending from a side of the first lead terminal in a second direction vertical to the first direction, and a second extension portion being band-shaped and extending from a side of the second lead terminal in the same direction as the second direction or the reverse direction, wherein the first and the second extension portions are bent in a third direction vertical to the first and the second directions, and tip portions of the first and second extension portions are further bent in the second direction and the reverse direction respectively.

According to another aspect of the invention, a semiconductor device is provided, which comprises a lead frame being provided with a mount bed, a first and a second lead terminal, and a first and a second extension portion being band-shaped, the first and the second lead terminals extending in parallel to each other in a first direction, the first extension portion extending from a side of the first lead terminal in a second direction vertical to the first direction, the second extension portion extending from a side of the second lead terminal in the same direction as the second direction or the reverse direction, a first connection conductor formed on the mount bed, a semiconductor chip mechanically connected to the first connection conductor, the semiconductor chip being attached to the mount bed, second connection conductors formed on tip portions of the first and the second extension portions, and an electronic component mechanically connected to the second connection conductors, the electronic component being attached to the tip portions of the first and second extension portions, wherein the first and the second extension portions are bent in a third direction vertical to the first and the second directions, the tip portions of the first and second extension portions are further bent in the second direction and the reverse direction respectively.

According to further another aspect of the invention, a semiconductor device is provided, which comprises a lead frame being provided with a mount bed, a first and a second lead terminal, and a first and a second extension portion being band-shaped, the first and the second lead terminals extending in parallel to each other in a first direction, the first extension portion extending from a side of the first lead terminal in a second direction vertical to the first direction, the second extension portion extending from a side of the second lead terminal in the same direction as the second direction or the reverse direction, a first connection conductor formed on the mount bed, a semiconductor chip mechanically connected to the first connection conductor, the semiconductor chip being attached to the mount bed, second connection conductors formed on tip portions of the first and the second extension portions, and an electronic component mechanically connected to the second connection conductors, the electronic component being attached to the tip portions of the first and second extension portions, wherein the first extension portion is bent in a direction between the second direction and a third direction vertical to the first and the second directions, the second extension portion is bent in a direction between the reverse direction of the second direction and the third direction, and the tip portions of the first and second extension portions are further bent in the second direction and the reverse direction respectively.

BRIEF DESCRIPTION OF THE DRAWINGS

FIG. 1A is a plan view, and FIG. 1B is a cross-sectional view taken along line A-A of FIG. 1A and seen in an arrow direction, the cross-sectional view showing the lead frame at a bent state.

FIGS. 2A through 2C show a semiconductor device according to the first embodiment of the present invention, where FIG. 2A is a plan view, FIG. 2B is a cross-sectional view taken along line B-B of FIG. 2A and seen in an arrow direction, and FIG. 2C is a side view.

FIG. 3A shows a case of the lead frame according to the first embodiment, and FIG. 3B shows a case of a comparative example.

FIG. 4A is a plan view, and FIG. 4B is a cross-sectional view.

FIG. 4C is a plan view, and FIG. 4D is a cross-sectional view.

FIG. 4E is a plan view, and FIG. 4F is a cross-sectional view.

FIG. 5A is a plan view, and FIG. 5B is a cross-sectional view taken along line C-C of FIG. 5A and seen in an arrow direction, the cross-sectional view showing the lead frame at a bent state.

FIG. 6A is a plan view, FIG. 6B is a cross-sectional view taken along line D-D of FIG. 6A and seen in an arrow direction, and FIG. 6C is a side view.

FIG. 7A is a plan view, and FIG. 7B is a cross-sectional view taken along line E-E of FIG. 7A and seen in an arrow direction and the cross-sectional view showing the lead frame at a bent state.

FIGS. 8A through 8C show a semiconductor device according to a third embodiment of the invention, where FIG. 8A is a plan view, FIG. 8B is a cross-sectional view taken along line F-F of FIG. 8A and seen in an arrow direction, and FIG. 8C is a side view.

FIG. 9A is a plan view, and FIG. 9B is a cross-sectional view taken along line G-G of FIG. 9A and seen in an arrow direction, the cross-sectional view showing the lead frame at a bent state.

FIGS. 10A through 10C show a semiconductor device according to the fourth embodiment of the invention, where FIG. 10A is a plan view, FIG. 10B is a cross-sectional view taken along line H-H of FIG. 10A and seen in an arrow direction, and FIG. 10C is a side view.

DETAILED DESCRIPTION OF THE INVENTION

The embodiments of the present invention will be hereinafter described with reference to the drawings.

Figure 1A:
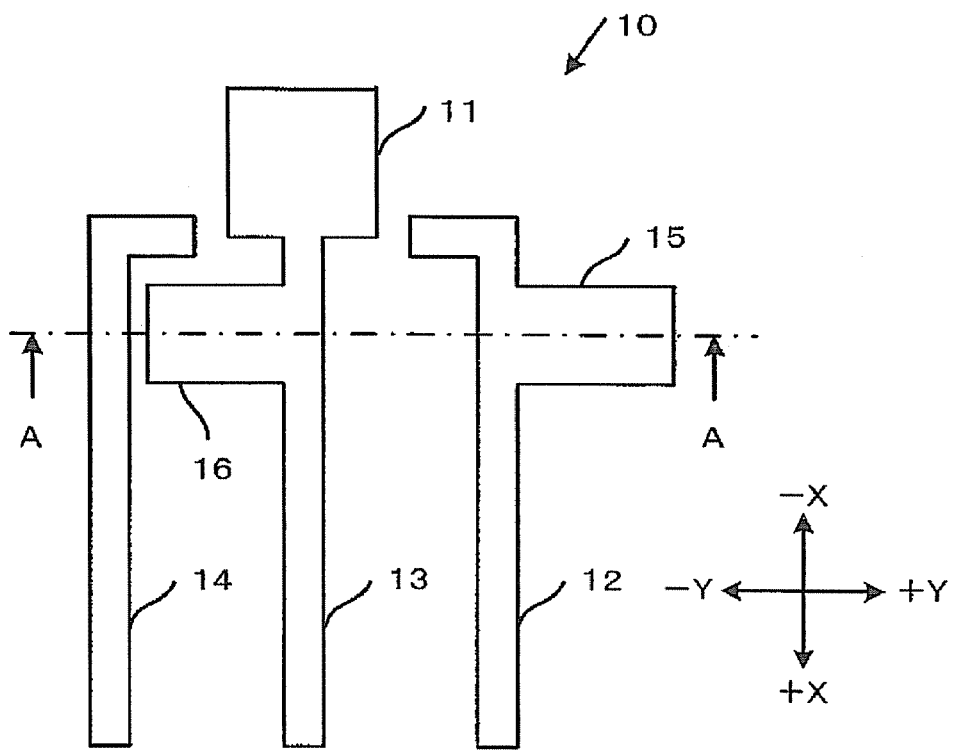
FIGS. 1A and 1B show a lead frame according to a first embodiment of the present invention, where
Figure 1B:
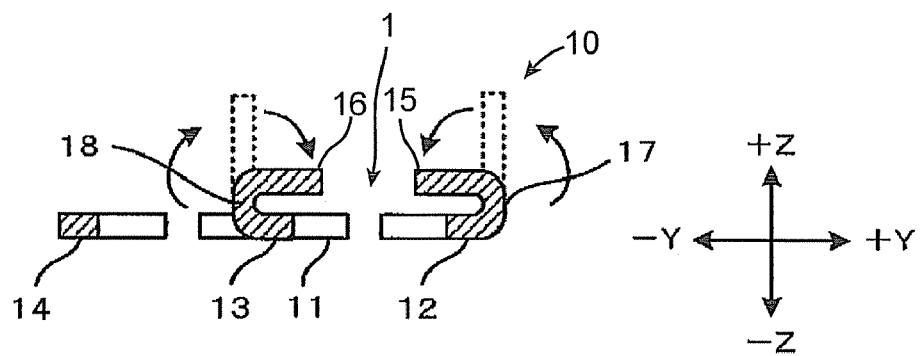

The lead frame according to the first embodiment of the present invention will be described with reference to FIGS. 1A and 1B. FIGS. 1A and 1B show the lead frame according to the first embodiment. FIG. 1A is a plan view. FIG. 1B is a cross-sectional view taken along line A-A of FIG. 1A and seen in an arrow direction. The cross-sectional view shows the lead frame at a bent state.

As shown in FIG. 1A, a lead frame 10 is provided with a mount bed 11 and lead terminals 12, 13 and 14. The mount bed mounts a semiconductor chip. In the semiconductor chip, a light receiving integrated circuit and other circuits are formed. The lead terminals 12, 13 and 14 are formed in parallel to each other. The lead terminals 12, 13 and 14 are electrically connected to the semiconductor chip via connection conductors, in assembling a semiconductor device.

Furthermore, the lead frame 10 has an extension portion 15 of a band-shape. The extension portion 15 extends from a side of the lead terminal 12. The lead frame 10 has a extension portion 16 of a band-shape. The extension portion 16 extends from a side of the lead terminal 13.

Specifically, the lead terminals 12, 13 and 14 extend in one direction (direction +X). End portions of the lead terminal 12 and 14 are bent toward the mount bed 11 to form an L shape and to close near the mount bed 11. An end portion of the lead terminal 13 is connected to the mount bed 11 to support the mount bed 11.

The extension portion 15 extends from the side of the lead terminal 12 in one direction (direction +Y). The extension portion 16 extends from the side of the lead terminal 13 in a direction (direction −Y) opposite to the one direction (direction +Y.

As shown in FIG. 1B, the extension portions 15 and 16 of the lead frame 10 are bent in the same direction (direction +Z) which is vertical to the extending direction (direction +X) of the lead terminals 12 and 13, in assembly of the semiconductor device.

Further, a tip portion of the extension portion 15 is bent in a direction (direction −Y) which is vertical to the extending direction (direction +X) of the lead terminal 12. A tip portion of the extension portion 16 is bent in a direction (direction +Y) which is vertical to the extending direction (direction +X) of the lead terminal 13.

By the bending, the tip portions of the extension portions 15 and 16 face each other and are spaced apart from each other. The lead frame 10 becomes to have U-shaped bent portions 17 and 18.

The lead frame 10 is manufactured by preparing a copper plate which is plated with nickel and silver in a thickness of nearly 0.15 mm, for example, and by processing the copper plate. With press-processing of the copper plate, the mount bed 11, the lead terminals 12, 13 and 14, and the extension portions 15, 16 are formed.

The mount bed 11 is approximately rectangular. The semiconductor chip is mounted on the center of the mount bed 11. Tip portions of the bent portions 17 and 18 serve as a component mounting portion 1 to mount a chip component (an electronic component) such as a resistor, a capacitor and other components. The chip component bridges the tip portions of the bent portions 17 and 18.

A semiconductor device, which employs the lead frame 10 according to the first embodiment of the invention, will be described with reference to FIGS. 2A through 2C.

FIGS. 2A through 2C show the semiconductor device according to the first embodiment. FIG. 2A is a plan view. FIG. 2B is a cross-sectional view taken along line B-B of FIG. 2A and seen in an arrow direction. FIG. 2C is a cross-sectional view. In FIGS. 2A through 2C, the same portions as those shown in FIGS. 1A and 1B are given the same reference numerals respectively.

As shown in FIGS. 2A through 2C, a semiconductor chip 21 such as a light receiving IC is mounted on the mount bed 11 to form a semiconductor device 20. The semiconductor chip 21 is electrically connected to lead terminals 12, 13 and 14 with bonding wires 25, 26 and 27.

A chip component 22, which has a length of L1, is placed to bridge the tip portions of the bent portions 17, 18. The chip component 22 is a laminated ceramics chip capacitor in the embodiment. A resin 23 molds the mount bed 11, the lead terminals 12, 13 and 14, the semiconductor chip 21 and the chip component 22 integrally.

The semiconductor chip 21 is mounted on the mount bed 11 with a conductive adhesive interposed in between. The conductive adhesive is a silver paste, for example, which serves as a connection conductor. The chip component 22 is mounted on the tip portions of the bent portions 17, 18 with a conductive adhesive 24 interposed in between. The conductive adhesive 24 is a silver paste, for example.

By employing a silver paste up and by heating the silver paste up to a predetermined temperature (120° c.) for curing, the semiconductor chip 21 and the chip component 22 are respectively fixed to the mount bed 11 and the tip portions of the bent portions 17 and 18.

The semiconductor chip 21 is electrically connected to thread terminals 12, 13 and 14 through wires 25, 26 and 27 by a wire bonding method.

When the lead terminal 13 is connected to a power source GND to supply a reference potential (a ground potential) and when the lead terminal 12 is connected to a power source Vcc, the semiconductor device 20 outputs an output voltage Vout to the lead terminal 14. The output voltage Vout depends on light incident to a light receiving surface of the light receiving IC 21.

The chip component 22 connects the lead terminal 13, 14. In the embodiment, the chip component 2 (a laminated ceramics chip capacitor) functions as a bypass capacitor between the power source Vcc and the power source GND.

Figure 3A:
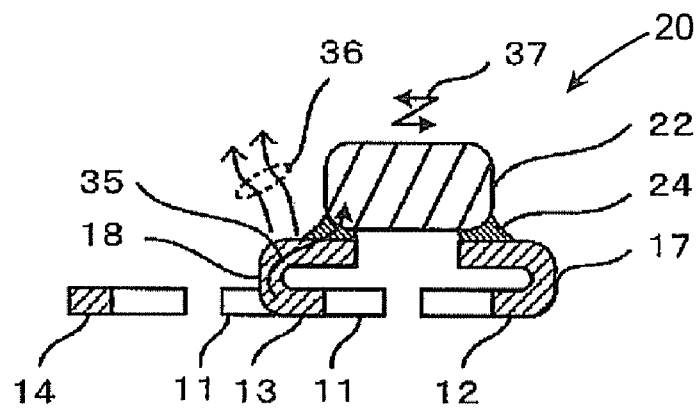
FIGS. 3A and 3B are views to show a function of a bent portion of the lead frame, where
Figure 3B:
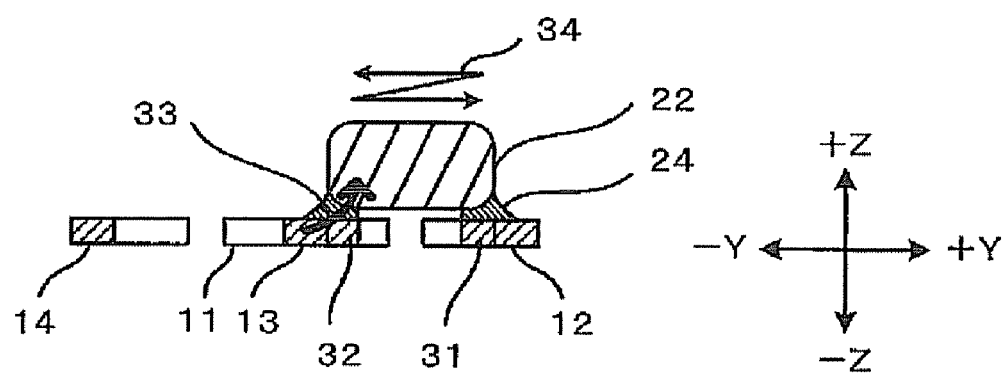

FIGS. 3A and 3B are views showing functions of bent portions 17 and 18 of the lead frame 10 according to the first embodiment, in comparison with a comparative example. FIG. 3A is a view showing the functions of the bent portions 17, 18. FIG. 3B is a view showing a function of the comparative example, which does not have a bent portion.

In FIGS. 3A and 3B, the same portions as those shown in FIGS. 1A and 1B and FIGS. 2A through 2C are given the same reference numerals respectively.

As shown in FIG. 3B, the lead frame of the comparative example has a band-shaped extension portion 31 which extends from a side of a lead terminal 12 in direction –Y. Furthermore, the lead frame of the comparative example includes a band-shaped extension portion 32 which extends from a side of a lead terminal 13 in direction +Y.

The chip component 22 is arranged to bridge the extension portion 31, which is a part of the lead terminal 12, and the extension portion 32, which is a part of the lead terminal 13, with a conductive adhesive 24 interposed in between.

The lead frame is employed to manufacture a semiconductor device. In manufacture the semiconductor device, a step of ultrasonic-bonding wires to the chip component 22 is needed. In the ultrasonic-bonding step, the lead frame is heated to a high temperature up to 200° c., for example. The heating process causes heat-transfer 33 from back surfaces of the lead terminals 12 and 13 to the conductive adhesive 24. The pathway of the heat transfer 33 is short so that the heat 33 may be readily transferred to the conductive adhesive 24. Consequently, the embrittlement of the conductive adhesive 24 is advanced so that reduction in adhesive force of the conductive adhesive 24 may occur.

When a wire is ultrasonic-bonded to the chip component 22 by applying an ultrasonic sound in a subsequent step, an impact force 34 of the ultrasonic-bonding is directly transmitted to the conductive adhesive 24 which has been embrittled by the high temperature. As a result, the conductive adhesive 24 cracks so that the chip component 22 may be in an electrically open state. In some cases, the chip component 22 may peel off, and the semiconductor device may become defective.

On the other hand, as shown in FIG. 3A, the chip component 22 is arranged to bridge the bent portions 17 and 18 with the conductive adhesive 24 interposed in between, according to the embodiment.

The presence of bent portions 17 and 18 makes the pathway of the heat transfer 35 longer than that of the comparative example so that the bent portions 17 and 18 cause heat release 36. It may be difficult that heat is transferred from the back surfaces of the lead terminal 12 and 13 to the conductive adhesive 24. The conductive adhesive 24 is consequently prevented from being embrittled.

Furthermore, as the bent portions 17 and 18 are elastic enough to show effect of absorbing vibration, impact force is moderated during ultrasonic bonding.

In the embodiment, the conductive adhesive 24 is prevented from cracking and being in an electrically open state in the aforementioned subsequent ultrasonic-bonding step. In the embodiment, defect of the chip component 22 which is caused by peeling off, is less likely to occur.

Thus, the semiconductor device 20, which is provided with the lead frame to mount the chip component 22, can be highly reliable.

In the embodiment, the chip component 22 is arranged near the bonding wires 25, 26 and 27. Accordingly, the size of the semiconductor device 20 is small.

In the embodiment, the extension portions 15 and 16 are bent in direction +Z and then are bent in directions –Y and +Y, respectively to form bent portions 17, 18 of the extension portions 15, 16. The bent portions 17, 18 may have various shapes other than those shown in FIGS. 1B, 2B and 3A.

Figure 4A:
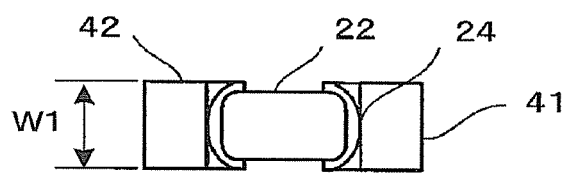
FIGS. 4A and 4B show a first modified example of bent portions of the lead frame, where
Figure 4B:
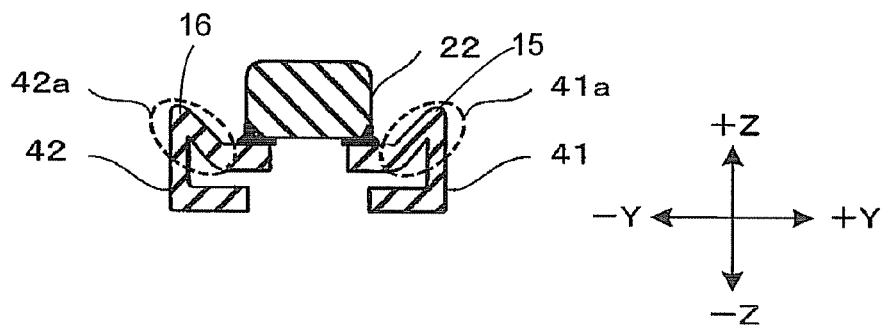

FIGS. 4A and 4B show a first modified example of the bent portions of the lead frame. FIG. 4A is a plan view. FIG. 4B is a cross-sectional view.

In FIGS. 4A and 4B, the extension portions 15 and 16 include bent portions 41 and 42 so that meandered portions 41a and 42a are provided, respectively. The meandered portions 41a and 42a are acute-angled. The extension portion 15 is bent in the direction +Z, then is bent in a direction between the directions –Y and –Z, and subsequently is bent in the direction –Y to form the meandered portion 41a.

In the same manner, the extension portion 16 is bent in the direction +Z, then is bent in a direction between the directions +Y and –Z, and is subsequently bent in the direction +Y to form the meandered portion 42a.

In the first modified example, the presence of the meandered portions 41a and 42a of the respective bent portions 41 and 42 makes the heat transfer pathway longer than that of the above first embodiment. As a result, in the first modified example, the effects of releasing heat and impact force of the ultrasonic sound can be further increased.

Figure 4C:
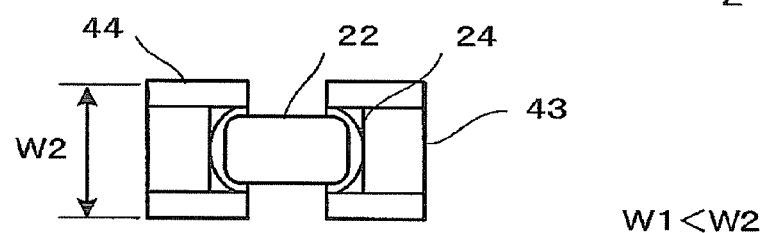
FIGS. 4C and 4D show a second modified example of bent portions of the lead frame, where
Figure 4D:
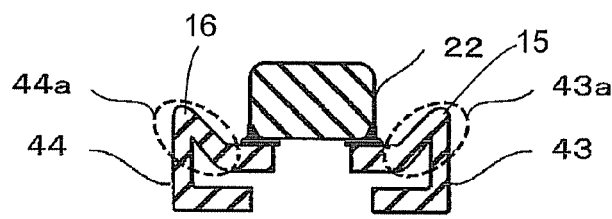

FIGS. 4C and 4D show a second modified example of the bent portions of the lead frame. FIG. 4C is a plan view. FIG. 4D is a cross-sectional view.

In FIGS. 4C and 4D, the extension portions 15 and 16 are bent to form meandered portions 43a and 44a, in the same manner as forming the meandered portions 41a and 42a of the first modified example. The meandered portions 43a and 44a are acute-angled. A width W2 of bent portions 43 and 44 including meandered portions 43a and 44a is larger than a width W1 of the bent portions 41 and 42 of the first modified example shown in FIG. 4A.

In FIG. 4A, the width W1 of the bent portions 41 and 42 accords with the width of the chip component 22 approximately. In the second modified example of FIG. 4C, the width W2 of the bent portions 43 and 44 is larger than the width of the chip component 22. Accordingly, the heat releasing effect can be further improved.

Figure 4E:
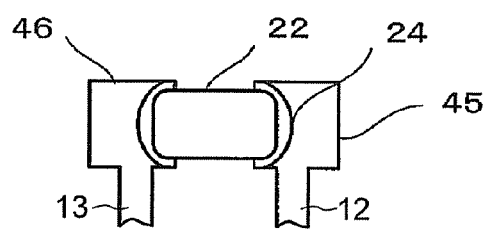
FIGS. 4E and 4F show a third modified example of bent portions of the lead frame, where
Figure 4F:
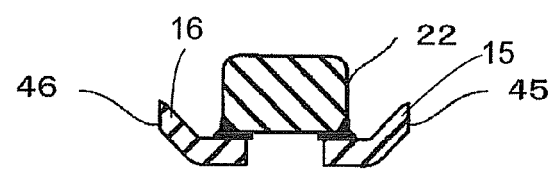

FIGS. 4E and 4F show a third modified example of the bent portions of the lead frame. FIG. 4E is a plan view. FIG. 4F is a cross-sectional view.

The extension portion 15 of FIG. 1A is obliquely bent in a direction between the directions −Z and +Y. The extension portion 16 of FIG. 1A is obliquely bent in a direction between the directions −Z and −Y. The tip portion of the extension portion 15 is further bent in the direction −Y, while the tip portion of the extension portion 16 is further bent in the direction +Y. Thus, the tip portions of the extension portions 15 and 16 form bent portions 45 and 46. The tip portions of the extension portions 15 and 16 face each other and are spaced apart from each other, below the lead terminals 12 and 13 (in direction −Z).

The configuration shown in FIGS. 4E and 4F allows the height of the chip component 22 from the lead frame 10 to be reduced. The chip component 22, which is mounted on the tip portions, bridges the tip portions of the bent portions 45 and 46. Therefore, the thickness of the resin 23 shown in FIG. 2B can be reduced in the directions ±Z.

In the above first embodiment, a light receiving IC is used for the semiconductor chip 21. In place of the light receiving IC, an element having three or more terminals such as a transistor can be used.

In the first embodiment, a chip capacitor is used for the chip component 22. In place of the chip capacitor, an electric component having two terminals, such as a chip resistor or a chip coil, can be used.

In the first embodiment, the lead frame 10 has lead terminals 12, 13 and 14 which extend in the direction +X. The number and the extending direction of lead terminals are not limited to the number and the direction of the first embodiment.

A dual inline package (DIP) type lead frame may be used as a lead frame. The dual inline package (DIP) type lead frame includes a plurality of lead terminals extending in the direction −X, for example. The number of chip components to be mounted can be increased corresponding to the number of lead terminals.

Figure 5A:
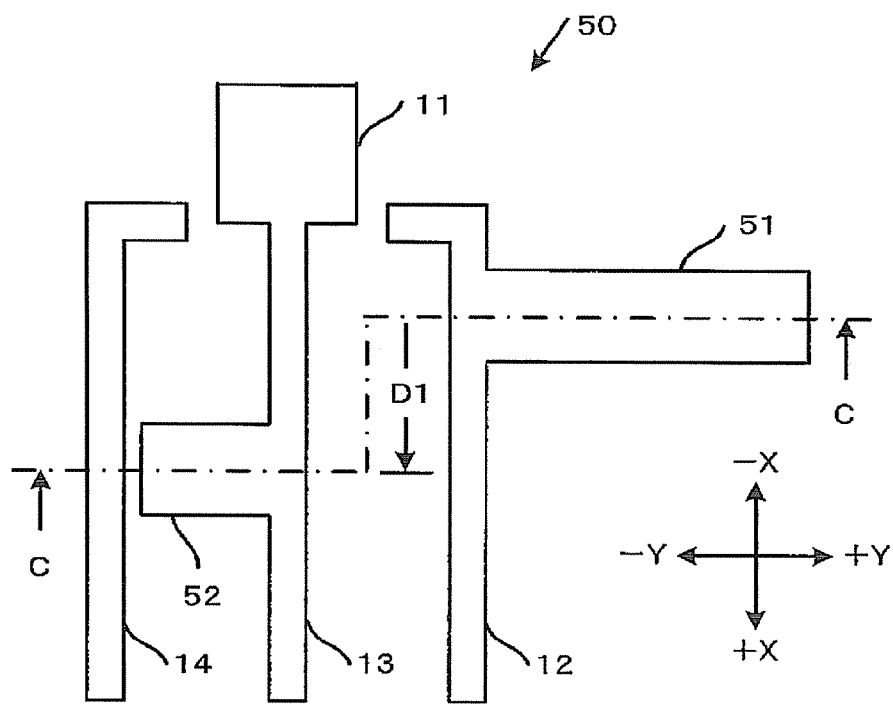
FIGS. 5A and 5B show a lead frame according to a second embodiment of the invention, where
Figure 5B:
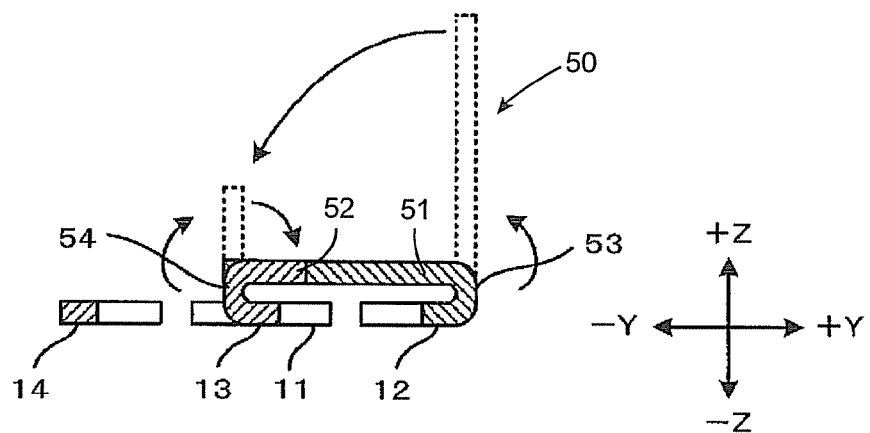

FIGS. 5A and 5B show a lead frame according to a second embodiment of the invention. FIG. 5A is a plan view. FIG. 5B is a cross-sectional view taken along line C-C of FIG. 5A and seen in an arrow direction. The cross-sectional view shows the lead frame at a bent state.

In the second embodiment, the same portions as those of the first embodiment shown in FIGS. 1A and 1B are given the same reference numerals respectively.

As shown in FIG. 5A, a lead frame 50 of the present embodiment includes an extension portion 51 which extends from a side of a lead terminal 12 in the direction +Y. The lead frame 50 further includes an extension portion 52 which extends from a side of a lead terminal 13 in the direction −Y.

The extension portion 52 is formed being spaced apart with a distance D1 from the extension portion 51 in the direction +X. The extension portion 51 is set to be longer than the extension portion 52.

As shown in FIG. 5B, the extension portions 51 and 52 of the lead frame 50 are processed to be bent in the direction +Z vertical to the direction +X. The lead terminals 12 and 13 extend portion in the direction +X.

The tip portion of the extension portion 51 is further bent in the direction −Y so that the extension portion 51 covers the upper side of the lead terminal 13. The tip portion of the extension portion 52 is bent in the direction +Y.

Thus, the tip portions of the respective extension portions 51 and 52 are parallel to each other so that U-shaped bent portions 53 and 54 are formed.

Figure 6A:
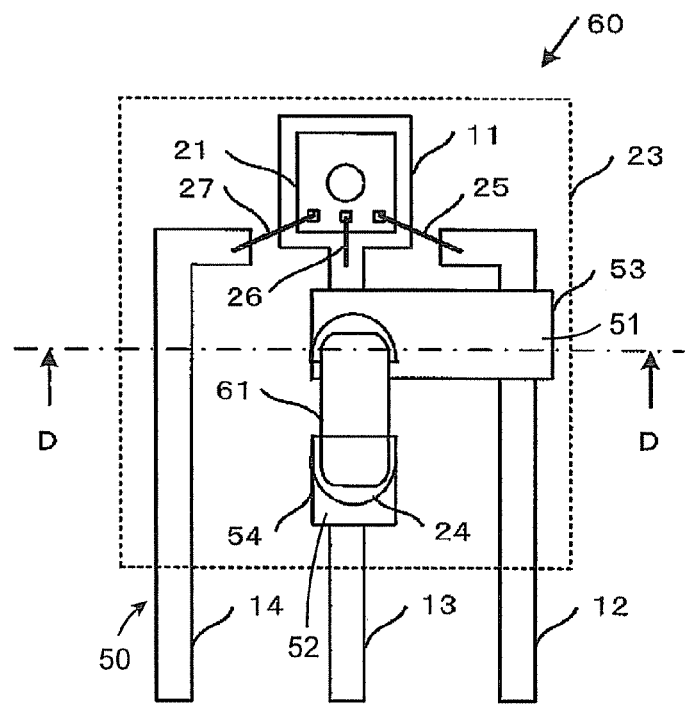
FIGS. 6A through 6C show a semiconductor device according to the second embodiment, where
Figure 6C:
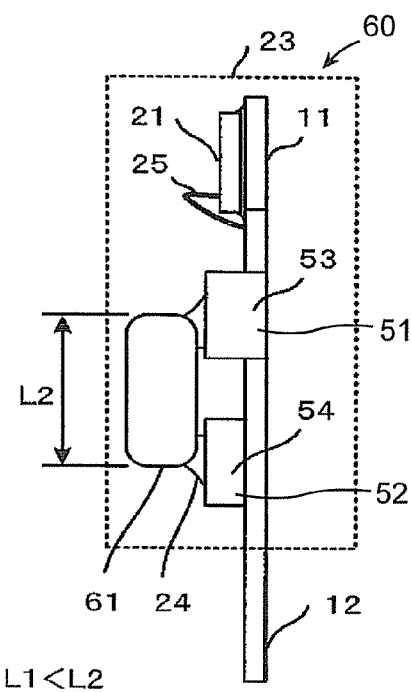
Figure 6B:
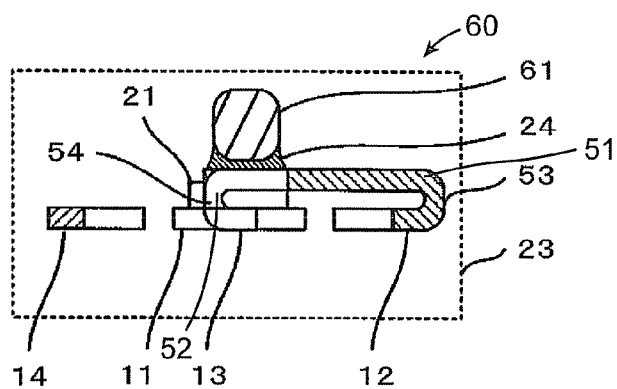

FIGS. 6A through 6C show a semiconductor device employing the lead frame 50 according to the second embodiment of the invention. FIG. 6A is a plan view. FIG. 6B is a cross-sectional view taken along line D-D of FIG. 6A and seen in an arrow direction. FIG. 6C is a cross-sectional view. In FIGS. 6A through 6C, the same portions as those shown in FIGS. 5A and 5B are given the same reference numerals respectively.

As shown in FIGS. 6A through 6C, a chip component 61 is arranged to bridge tip portions of bent portions 53, 54 in a semiconductor 60.

The chip component 61 is arranged above the lead terminal 13 and is disposed in parallel to the lead terminal 13. The length L2 of the chip component 61 is larger than the length L1 of the chip component 22 shown in FIG. 2.

The spaced distance D1 between the extension portions 51 and 52 can be changed corresponding to the length L2 of the chip component 61 to be mounted on the extension portions 51 and 52.

The semiconductor device 60 is provided with the lead frame 50 and the chip component 61. The chip component 61 may have a length L2 which is large.

Figure 7A:
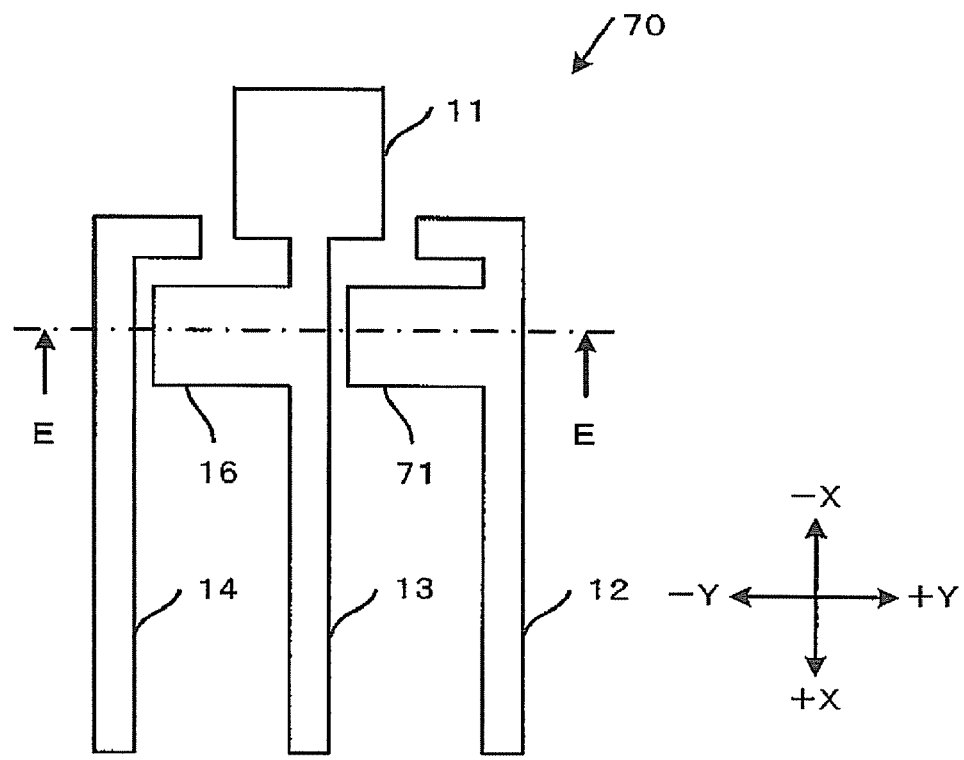
FIGS. 7A and 7B show a lead frame according to a third embodiment of the invention, where
Figure 7B:
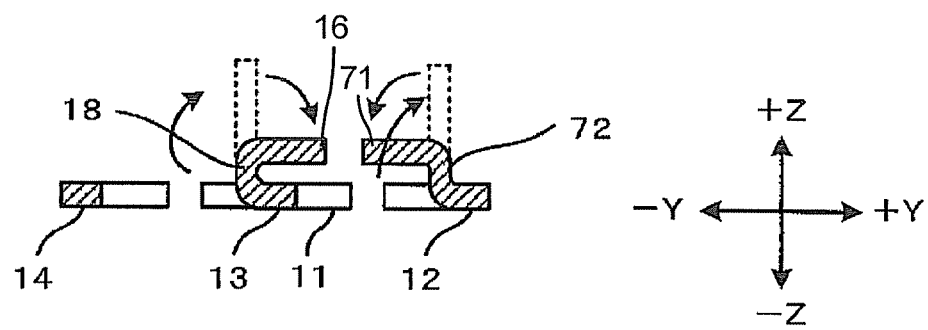

FIGS. 7A and 7B show a lead frame according to a third embodiment of the invention, where FIG. 7A is a plan view, and FIG. 7B is a cross-sectional view taken along line E-E of FIG. 7A and seen in an arrow direction. The cross-sectional view shows the lead frame at a bent state.

In the present embodiment, the same components as those of the first embodiment shown in FIGS. 1A and 1B are given the same reference numerals.

As shown in FIG. 7A, a lead frame 70 of the present embodiment includes an extension portion 71 which extends from a side of a lead terminal 12 in the direction −Y. The lead frame 70 of the present embodiment further includes an extension portion 16 which extends from a side of a lead terminal 13 in the direction −Y.

As shown in FIG. 7B, during processing, the extension portions 71 and 16 of the lead frame 70 are bent in the direction +Z vertical to direction +X. The lead terminals 12 and 13 extend in the direction +X.

The tip portion of the extension portion 71 is further bent in the direction −Y. The tip portion of the extension portion 16 is bent in the direction +Y.

Thus, a bent portion 72 having a crank-shaped cross-section surface is formed in the extension portion 71. A bent portion 18 having a U-shaped cross-section surface is formed in the extension portion 16. The tip portions of the extension portions 71 and 16 face each other and are spaced apart from each other.

FIGS. 8A through 8C show a semiconductor device employing the lead frame 70 according to the third embodiment of the invention. FIG. 8A is a plan view. FIG. 8B is a cross-sectional view taken along line F-F of FIG. 8A and seen in an arrow direction. FIG. 8C is a cross-sectional view.

As shown in FIGS. 8A through 8C, a chip component 81 is placed to bridge the tip portions of the bent portions 72 and 18 in a semiconductor device 80. The length L3 of a chip component 81 is smaller than the length L1 of the chip component 22 shown in FIG. 2.

The lead frame 70 is suitable for a case where the length L3 of the chip component 81 is small.

Figure 9A:
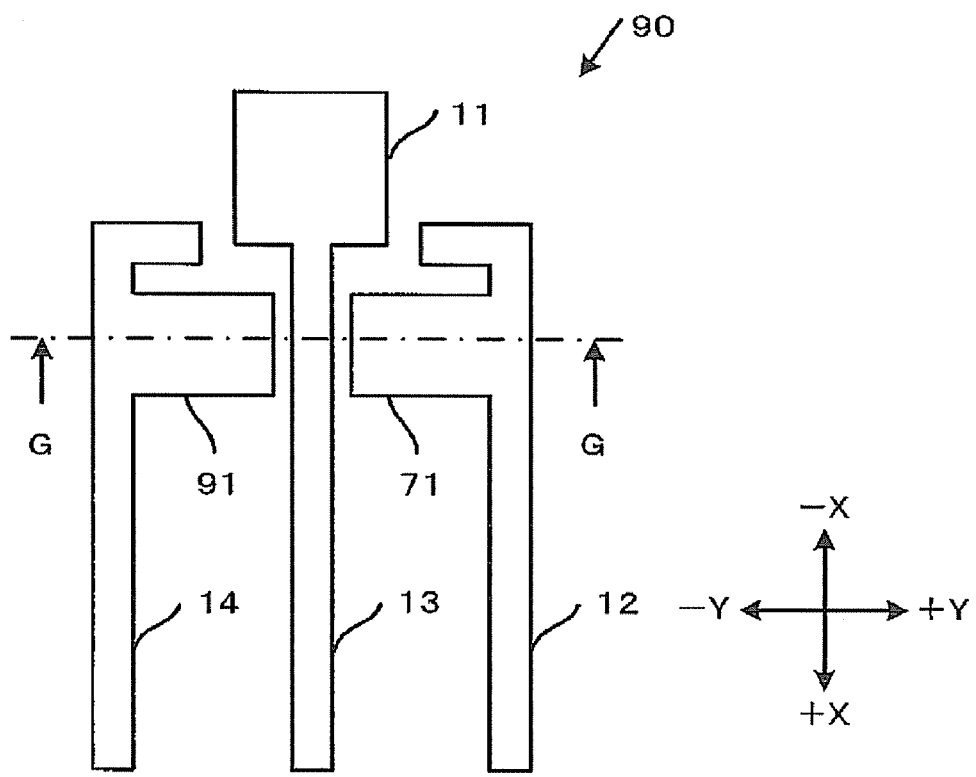
FIGS. 9A and 9B show a lead frame according to a fourth embodiment of the invention, where
Figure 9B:
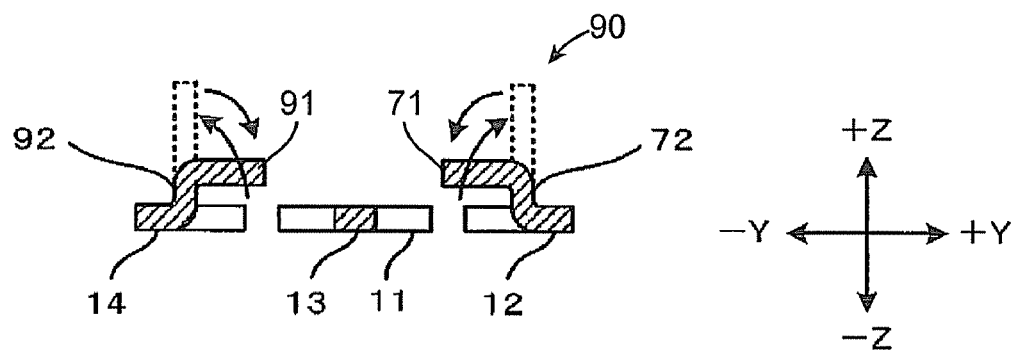

FIGS. 9A and 9B show a lead frame according to a fourth embodiment of the invention, where FIG. 9A is a plan view, and FIG. 9B is a cross-sectional view taken along line G-G of FIG. 9A and seen in an arrow direction. The cross-sectional view shows the lead frame at a bent state.

In the present embodiment, the same portions as those of the first embodiment are given the same reference numerals respectively.

As shown in FIG. 9A, a lead frame 90 of the present embodiment includes an extension portion 71 which extends from a side of the lead terminal 12 in the direction −Y.

The lead frame 90 has an extension portion 91 which extends in the direction +Y from a side of the lead terminal (third lead terminal) 14 arranged in parallel to the lead frames 12 and 13.

As shown in FIG. 9B, in processing the lead frame 90, the extension portions 71 and 91 of the lead frame 90 are bent in the direction +Z vertical to direction +X. The lead terminals 12 and 14 extend in the direction +X.

The tip portion of the extension portion 71 is further bent in the direction −Y. The tip portion of the extension portion 91 is bent in the direction +Y.

With such a processing, bent portions 72 and 92 having crank-shaped cross-section surfaces are respectively formed. The tip portions of the extension portions 71 and 91 face each other and are spaced apart from each other.

FIGS. 10A through 10C show a semiconductor device employing the lead frame 90 according to the fourth embodiment of the present invention. FIG. 10A is a plan view. FIG. 10B is a cross-sectional view taken along line H-H of FIG. 10A and seen in an arrow direction. FIG. 10C is a cross-sectional view.

As shown in FIGS. 10A through 10C, a chip component 101 is arranged to bridge the tip portions of the bent portions 72 and 92 in a semiconductor device 100. The length L4 of the chip component 101 is larger than the length L1 of the chip component 22 shown in FIG. 2B.

The extension portion 71 does not extend to the outside (in the direction +Y of FIGS. 9A and 9B) of the lead terminal 12. In the same manner, the extension portion 91 does not extend to the outside (in the direction −Y of FIGS. 9A and 9B) of the lead terminal 14. Consequently, the lead frame 90 or the semiconductor device 100 has a smaller width in the directions ±Y shown in FIGS. 9A and 9B than that of the lead frame 10 or semiconductor device 20 of the first embodiment.

The longitudinal direction of a copper plate, for example, wound around a reel is set to the directions ±Y in manufacturing the lead frame 90 or the semiconductor device 100. A large number of lead frames are formed to position in parallel with each other in the longitudinal direction of the copper plate.

In such a case, when the lead frames are processed to form the shape of the lead frame 90 of the fourth embodiment, the number of lead frames to be taken from the copper plate can be increased as compared with the case where the lead frame 10 of the first embodiment is employed.

On the other hand, when the longitudinal direction of the copper plate is set to the directions ±X, a large number of lead frames of the fourth embodiment may be produced from a copper plate by arranging the lead frames in the longitudinal direction of the copper plate, even when the copper plate has a narrow width.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A lead frame, comprising:
    a mount bed to mount a semiconductor chip;
    first and second lead terminals which extend in parallel to each other in a first direction;
    a first extension portion being band-shaped and extending from a side of the first lead terminal in a second direction vertical to the first direction; and
    a second extension portion being band-shaped and extending from a side of the second lead terminal in the same direction as the second direction or the reverse direction, wherein
    the first and the second extension portions are bent in a third direction vertical to the first and the second directions, tip portions of the first and second extension portions are further bent in the second direction and the reverse direction respectively.

2. The lead frame according to claim 1, wherein the first and second extension portions face each other.

3. The lead frame according to claim 1, wherein the first and the second extension portions extend from a first and a second connection portions respectively connected to the sides of the first and the second lead terminals in directions opposite to each other.

4. The lead frame according to claim 1, wherein the first and the second extension portions extend from a first and a second connection portions respectively connected to the sides of the first and the second lead terminals in such directions that the first and second extension portions come close to each other.

5. The lead frame according to claim 1, wherein the first and the second extension portions extend from a first and a second connection portions respectively connected to the sides of the first and the second lead terminals in the same direction.

6. The lead frame according to claim 1, wherein the first and second extension portions are spaced apart from each other in the first direction.

7. The lead frame according to claim 1, further comprising a third lead terminal.

8. A semiconductor device, comprising:
    a lead frame being provided with a mount bed, a first and a second lead terminal, and a first and a second extension portion being band-shaped, the first and the second lead terminals extending in parallel to each other in a first direction, the first extension portion extending from a side of the first lead terminal in a second direction vertical to the first direction, the second extension portion extending from a side of the second lead terminal in the same direction as the second direction or the reverse direction;
    a first connection conductor formed on the mount bed;
    a semiconductor chip mechanically connected to the first connection conductor, the semiconductor chip being attached to the mount bed;

second connection conductors formed on tip portions of the first and the second extension portions; and an electronic component mechanically connected to the second connection conductors, the electronic component being attached to the tip portions of the first and second extension portions, wherein the first and the second extension portions are bent in a third direction vertical to the first and the second directions, the tip portions of the first and second extension portions are further bent in the second direction and the reverse direction respectively.

9. The semiconductor device according to claim 8, wherein the electronic component is arranged to bridge the tip portions of the first and second extension portions.

10. The semiconductor device according to claim 8, wherein the second connection conductors are conductive adhesive.

11. The semiconductor device according to claim 8, wherein at least one of the first and second lead terminals is connected to the semiconductor chip with a bonding wire.

12. The semiconductor device according to claim 8, wherein the lead frame further includes a third lead terminal.

13. The semiconductor device according to claim 8, wherein the first and second extension portions face each other.

14. The semiconductor device according to claim 8, wherein the first and the second extension portions extend from a first and a second connection portions respectively connected to the sides of the first and second lead terminals in directions opposite to each other.

15. The semiconductor device according to claim 8, wherein the first and the second extension portions extend from a first and a second connection portions respectively connected to the sides of the first and second lead terminals in such directions that the first and second extension portions come close to each other.

16. The semiconductor device according to claim 8, wherein the first and the second extension portions extend from a first and a second connection portions respectively connected to the sides of the first and second lead terminals in the same direction.

17. The semiconductor device according to claim 8, wherein the first and second extension portions are spaced apart from each other in the first direction.

18. The semiconductor device according to claim 8, wherein the mount bed and one of the first and second lead terminals are mechanically connected to each other.

19. A semiconductor device, comprising:

a lead frame being provided with a mount bed, a first and a second lead terminal, and a first and a second extension portion being band-shaped, the first and the second lead terminals extending in parallel to each other in a first direction, the first extension portion extending from a side of the first lead terminal in a second direction vertical to the first direction, the second extension portion extending from a side of the second lead terminal in the same direction as the second direction or the reverse direction;

a first connection conductor formed on the mount bed;

a semiconductor chip mechanically connected to the first connection conductor, the semiconductor chip being attached to the mount bed;

second connection conductors formed on tip portions of the first and the second extension portions; and an electronic component mechanically connected to the second connection conductors, the electronic component being attached to the tip portions of the first and second extension portions, wherein the first extension portion is bent in a direction between the second direction and a third direction vertical to the first and the second directions, the second extension portion is bent in a direction between the reverse direction of the second direction and the third direction, and the tip portions of the first and second extension portions are further bent in the second direction and the reverse direction respectively.

* * * * *